United States Patent
Winter et al.

(10) Patent No.: US 7,088,215 B1
(45) Date of Patent: Aug. 8, 2006

(54) EMBEDDED DUO-PLANAR PRINTED INDUCTOR

(75) Inventors: Frank B. Winter, San Diego, CA (US); Harry S. Harberts, San Marcos, CA (US); Julius G. Tolan, Melbourne, FL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/053,520

(22) Filed: Feb. 7, 2005

(51) Int. Cl.
*H01F 5/00* (2006.01)

(52) U.S. Cl. ............ 336/200; 336/232; 336/223; 29/602.1

(58) Field of Classification Search ......... 336/200, 336/232, 223; 29/602.1, 605
See application file for complete search history.

(56) References Cited

U.S. PATENT DOCUMENTS

| | | | |
|---|---|---|---|
| 5,610,569 A * | 3/1997 | Hwang et al. | 336/200 |
| 6,031,445 A * | 2/2000 | Marty et al. | 336/200 |
| 6,531,945 B1 * | 3/2003 | Ahn et al. | 336/200 |
| 6,542,379 B1 | 4/2003 | Lauffer et al. | |
| 2004/0196132 A1 * | 10/2004 | Yu et al. | 336/223 |
| 2004/0263308 A1 | 12/2004 | Yu et al. | |

FOREIGN PATENT DOCUMENTS

| DE | 43 06 416 A1 | 9/1994 |
|---|---|---|
| DE | 198 42 523 A1 | 3/2000 |

* cited by examiner

*Primary Examiner*—Anh Mai
(74) *Attorney, Agent, or Firm*—Carmen B. Patti & Assoc., LLC

(57) ABSTRACT

A highly compact inductor formed on opposite faces of a dielectric substrate. Sets of parallel spaced conductive traces formed on the opposite faces of the substrate are interconnected by metallized vias through the substrate, in such a way as to form a continuous spiral conductive path. The inductor is preferably formed as two closely adjacent segments, each with conductive traces on each face of the substrate and each having metallized vias interconnecting the conductive traces. The segments are electrically connected in series and produce a magnetic field that extends through each segment in opposite directions and is closely coupled from one segment to the other. The inductor is, therefore, electromagnetically similar to a wire-wound toroidal inductor, providing high inductance and contourable Q values, but is highly compact, especially in the z-axis direction normal to the substrate.

11 Claims, 6 Drawing Sheets

EMBEDDED DUO-PLANAR PRINTED INDUCTOR

BACKGROUND OF THE INVENTION

This invention relates generally to inductors of compact design and, more particularly, to inductors that can be fabricated in printed circuit form. Conventional inductor technology for high-frequency (HF) filters, typically in the 10 s of Megahertz (MHz), require filter inductor values as high as one or two microhenries (uH). Physical realization of inductance can be achieved in a number of ways, but is largely dependent upon the inductor application; the frequency of operation and available physical space. In general, achieving a larger value of inductance requires a physical inductor with a larger volume. A larger volume also results in an inductor with a higher quality factor (Q). The Q of an inductor may be thought of as the ratio of the reactance of the inductor (measured by the product $\omega L$, where $\omega$ is angular frequency and L is the inductance) to the resistance of the inductor. Q is also defined, in the context of a tuned circuit or a filter, as the ratio of bandwidth to center frequency.

Filters perform the function of selectively transmitting or rejecting electrical signals over a desired band of frequencies. Passive filters typically include a combination of inductors and capacitors selected to obtain the desired performance characteristics. A figure of merit for any filter is defined by it's ability to reject certain frequencies and pass others. For a bandpass filter, the ratio of filter bandwidth to center frequency is commonly referred to as the Q of the filter. The reciprocal ratio expresses the percent bandwidth (% BW) of the filter. For narrow bandwidth filters (i.e., filters with high Q or low % BW), the circuit element (inductor or capacitor) with the lowest Q in general determines the narrowest achievable bandwidth and shape factor of the filter. For filters operating in the HF band, filter capacitances typically have capacitance values less than 200 pF (picoFarads). Because these capacitance values are routinely available with high unloaded a's (greater than 200), in most HF filters inductors are the circuit elements that limit the performance of the filters. Therefore, the design of inductors to achieve high unloaded Q values is of critical importance in the design of HF filters.

Self resonance is also very important for filter design because frequency rejection is predicated upon a specific value of inductance at a given frequency; and operating an inductor at or near self resonance increases or decreases this value, and an inductor may "act" as a capacitor beyond the self resonance point. This is true also of capacitors, which may become inductive beyond the self resonance point. In summary, then, high Q and high self resonant modes are key figures of merit for inductors.

Although inductors with ideal electrical characteristics are easy enough to construct if there is no volume limitation, a competing goal is to make inductors as compact as possible for use in radio-frequency (RF) communication devices. Consistent with this goal, inductors have been designed or proposed for use in conjunction with printed circuit boards. Generally, there are two types: (a) printed/planar inductors in the form of metal traces in spiral, octagonal or other patterns, or (b) wire-wound inductors of cylindrical/solenoidal or toroidal shape, which are typically encapsulated and surface mounted on a printed circuit board. Although some of these structures may be designed to have a relatively high Q value, a common drawback to the latter structures is that surrounding metal structures acting as RF or AC return paths effectively lower the Q value, referred to as "de-Qing." This phenomenon is also referred to as the "lid effect" when filters are placed in metal cavities. This undesirable effect typically arises because of parasitic capacitances to ground. Currents are induced in these structures, reducing the effective inductance, and also reducing the components' Q value.

The goal of achieving both a compact inductor volume for large inductance and Q values has remained largely elusive to designers. Larger inductance values can be realized either by using a large cross-sectional area for each turn of a conductor or wire forming the inductor, or by using an increased number of turns. In addition, embedding a high permittivity material, such as a ferrite mixture, in the magnetic flux field of the inductor further increases the inductance value. Unfortunately, increasing the cross-sectional area or the number of turns is not consistent with the goal of compactness, and one drawback of adding high permittivity material is that the increase in inductance value is obtained at a cost of a lower effective Q factor.

Accordingly, there is still a need for an alternative approach to the construction of a more compact inductor that has desirable electrical properties and without the drawbacks of the prior art. The present invention satisfies this need.

SUMMARY OF THE INVENTION

The present invention resides in a printed inductor structure formed in two planar layers of a printed circuit board. Briefly, and in general terms, the inductor structure of the invention comprises a dielectric substrate having upper and lower faces; a first set of parallel conductive traces formed on the upper face of the substrate; a second set of parallel conductive traces formed on the lower face of the substrate; and a plurality of metallized vias extending through the substrate and interconnecting the first and second sets of conductive traces to form a horizontal continuous spiral path with desirable (low loss, high Q) inductive properties.

Preferably, the first and second sets of parallel conductive traces are arranged in two adjacent ranks and the metallized vias and the conductive/metallized traces form a first spiral path and a second spiral path that constitute two closely adjacent inductor segments. The structure further comprises a conductive trace that connects the first and second spiral paths in series. The first and second spiral paths form spatially parallel, serially connected inductor segments that are magnetically coupled together to form a composite inductor with desirably high inductance and Q values.

In the disclosed embodiment of the invention, the metallized vias are formed in a direction normal to the upper and lower faces of the substrate. To complete the spiral configuration, the first and second sets of parallel conductive traces are angularly offset with respect to each other, such that each metallized via makes a connection from one end of a conductive trace in the first set to an end of the next successive trace in the second set. The inductor may further comprise additional dielectric layers covering the sets of conductive traces on the upper and lower faces of the substrate.

In terms of a method for making a compact inductor embedded in a printed circuit board structure, the invention comprises the steps of providing a dielectric substrate having upper and lower faces; forming a first set of generally parallel conductive traces on the upper face of the substrate; forming a second set of generally parallel conductive traces on the lower face of the substrate; and forming a plurality of conductive vias through the substrate at positions corresponding to ends of the conductive traces. The first and second sets of conductive traces and the plurality of conductive vias together form a continuous spiral conductive path with desirable inductance properties.

Preferably, the method further comprises forming additional parallel conductive traces on the upper and lower faces of the substrate and additional conductive vias through the substrate. The additional conductive traces and the additional vias together form a second continuous spiral conductive path closely adjacent to the continuous spiral conductive path formed by the first and second sets of conductive traces. The method further comprises forming an electrical connection between the continuous spiral conductive paths, thereby connecting them electrically in series in such a way that current flowing through the two spiral conductive paths will produce oppositely directed magnetic flux fields through the two respective adjacent spiral paths. The oppositely directed magnetic flux fields closely couple to each other at the ends of the spiral paths, to produce a tightly coupled magnetic circuit and high values of inductance and Q factor.

Due to the highly contained magnetic fields, similar to a toroid, the presence of nearby metallic, or otherwise conducting structures forming a return AC or RF path, is less pronounced. The reduced "lid effect" thus is presented and increases realized Q and increases the structures self-resonant operating frequency: both very desirable from a circuit standpoint (better LC filter: lower loss, better selectivity, as an example). Further the physical implementation thus allows tighter, more volume efficient construction techniques, otherwise unobtainable from conventional solenoidal implementations.

It will be appreciated from the foregoing that the present invention represents a significant advance in the design of inductors for high frequency circuits. In particular, the invention provides a highly compact printed inductor on two layers of a circuit board and provides high inductance values and high Q factors in an extremely small volume. Moreover, the inductor of the invention is convenient to manufacture using conventional printed circuit board fabrication techniques. Other aspects and advantages of the invention will become apparent from the following more detailed description, taken in conjunction with the accompanying drawings.

DETAILED DESCRIPTION OF THE INVENTION

Figure 1:
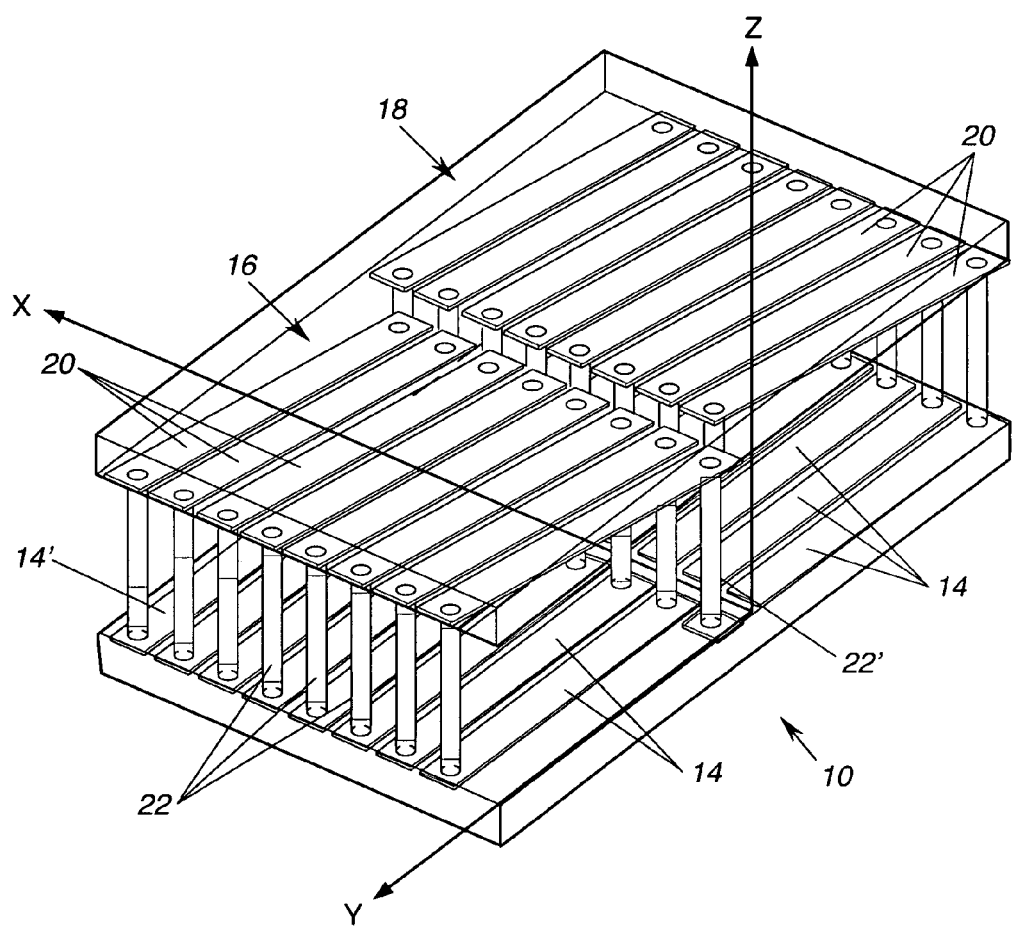
FIG. 1 is a perspective view of a printed duo-planar inductor in accordance with the invention, with a substrate considered transparent for purposes of illustration.

As shown in the drawings for purposes of illustration, the present invention is concerned with printed inductors formed on a printed circuit board structure. Prior to this invention, printed inductors used spiral traces or traces of other shapes on a single metallized layer of a printed circuit board. Alternatively, wire-coiled inductors may be surface mounted on a printed circuit board. Neither of these solutions has been able to achieve desirably high values of inductance and a lower frequency contourable Q in a compact structure.

Figure 2:
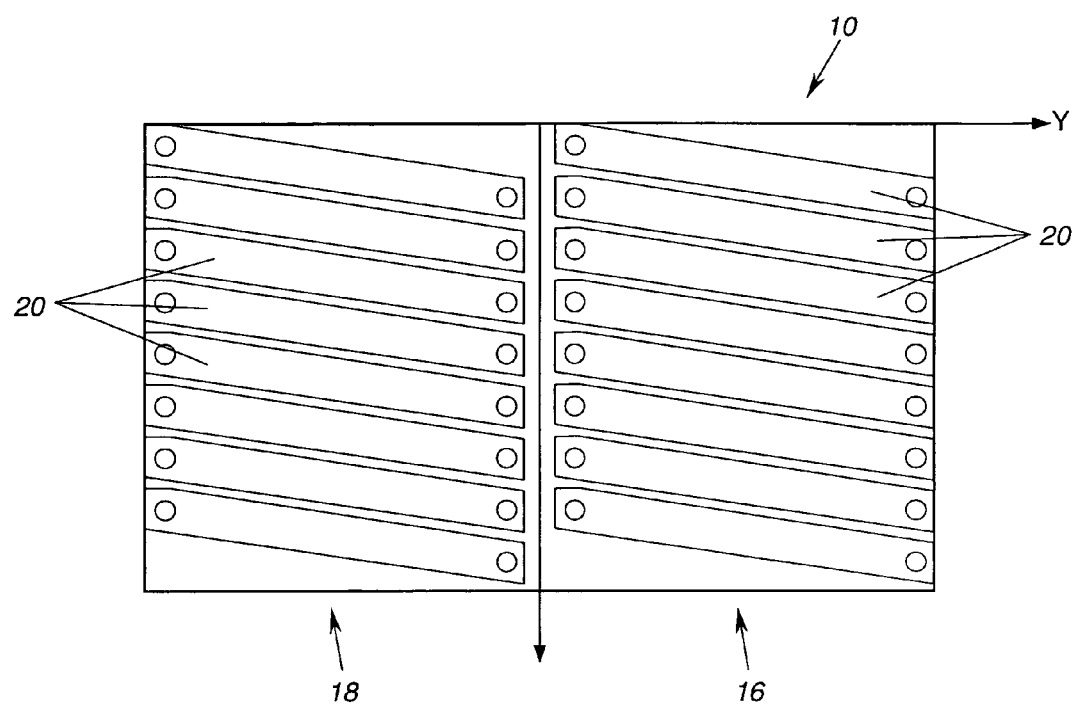
FIG. 2 is a top plan view of the inductor of FIG. 1.
Figure 3:
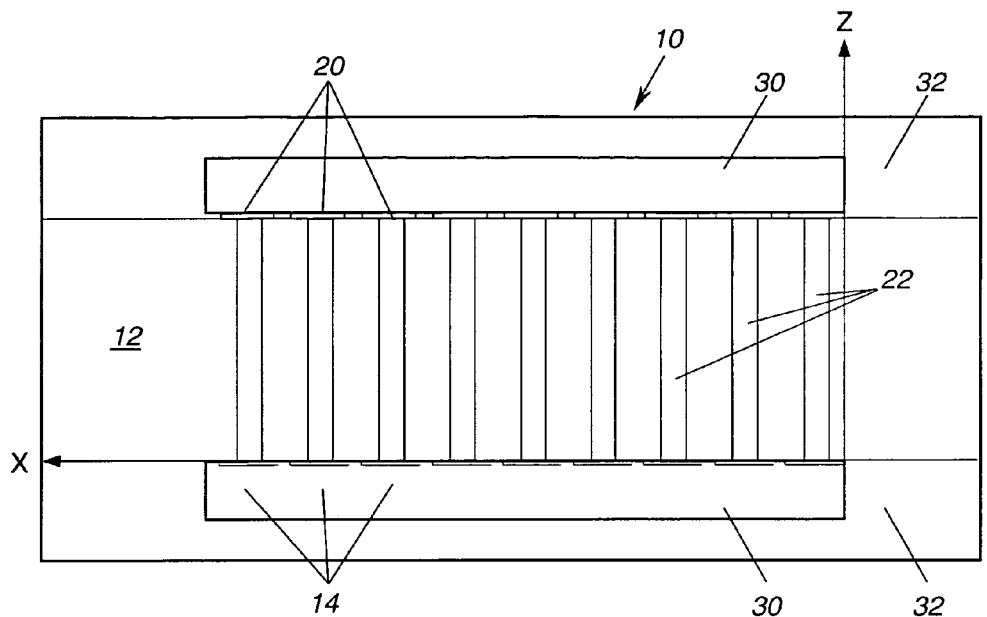
FIG. 3 is a lateral elevation view of the inductor of FIG. 1.
Figure 4:
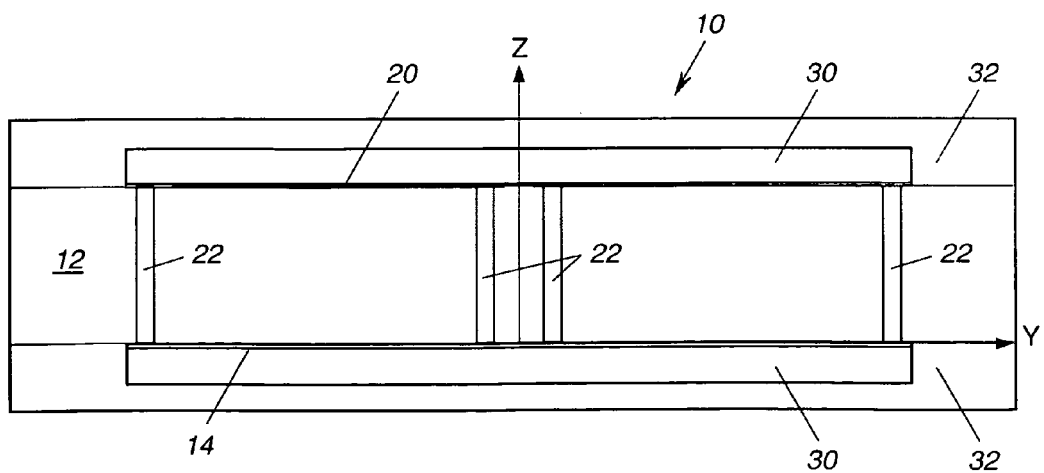
FIG. 4 is a front or end elevation view of the inductor of FIG. 1.

In accordance with the present invention, a printed inductor takes the form of conductive traces in two parallel planar layers of a printed circuit board structure, the conductive traces being electrically connected by metal vias extending between the two planar layers. The details of this construction are best shown in the perspective view of FIG. 1, considered in conjunction with the top view, lateral view and front view of FIGS. 2–4, respectively. Basically, the inductor (indicated generally by reference numeral 10) is formed on a dielectric substrate 12. On one face of the substrate 12 (the lower face as shown in the drawings), a plurality of parallel metallized traces 14 are formed. The traces 13 are of approximately equal length and they arranged in parallel in two arrays that form part of two adjacent inductor segments 16 and 18. On the opposite (upper) face of the substrate 12, two arrays of additional metallized traces 20 are formed. The traces 20 are parallel with each other, but not parallel with the lower traces 14. Specifically, the upper traces 20 are angled with respect to the lower traces 14 and each upper trace is located with one end vertically above a corresponding lower trace and with its other end vertically above an adjacent lower trace. Metallized vias 22 are formed through the substrate 12 and connect vertically co-located ends of the traces 14 and 20. Thus, a conductive "turn" is formed by each pair of (upper and lower) traces 20 and 14 and a corresponding pair of vias 22.

Each inductor segment 16 or 18 thus includes multiple conductive "turns" connected in series to form a spiral "coil" of conductors. It will be noted from FIG. 1 that the first trace 20' at the right-hand end of inductor segment 16 terminates at a via 22' that serves as one terminal of the inductor. At the opposite (left-hand) end of the inductor segment 16, the last lower trace 14' is extended across the substrate 12 to connect with the first via in the other inductor segment 18, thus connecting the two segments in series. The second terminal of the inductor 10 is provided by the last (rightmost) lower trace 14 in the inductor segment 18.

In terms of its electromagnetic properties, the inductor 10 functions very much like a toroidal inductor. There is strong magnetic coupling through the air (or substrate) at the ends of the inductor segments 16 and 18. In effect, the inductor 10 achieves wire-wound toroidal inductor properties in an extremely compact space between two planar layers, using a geometry that is composed of conveniently straight lines and orthogonal relationships. The inductor 10 may be considered as a conveniently "deformed" toroid, which has been separated into two halves, straightened out into parallel segments and then "squashed" between two closely spaced planar layers. The term "rectoid" has been coined by the inventors to connote a shape that includes both rectangular and toroidal properties.

If desired for a particular application, the conductive traces 14 and 20 may be embedded by additional overlying layers 30 and 32 of suitable dielectric materials.

The structure of the invention provides a beneficial mutual coupling between closely adjacent "windings", which increases the effective inductance per unit volume of the device. The structure also provides a high immunity to de-Qing effects of surrounding metallized structures, and achieves highly desirable Q values over a relatively wide range of frequencies of operation. An important additional advantage is ease of manufacture to repeatable inductance tolerances. Moreover, the structure can be manufactured at relatively low cost using well developed printed circuit board techniques. The inductor 10 can be used as a standalone device or may be printed in a circuit board structure with other related components to realize, for example, an LC filter, matching element, RF choke or other resonant structure (i.e., VCO resonator structure).

Figure 5:
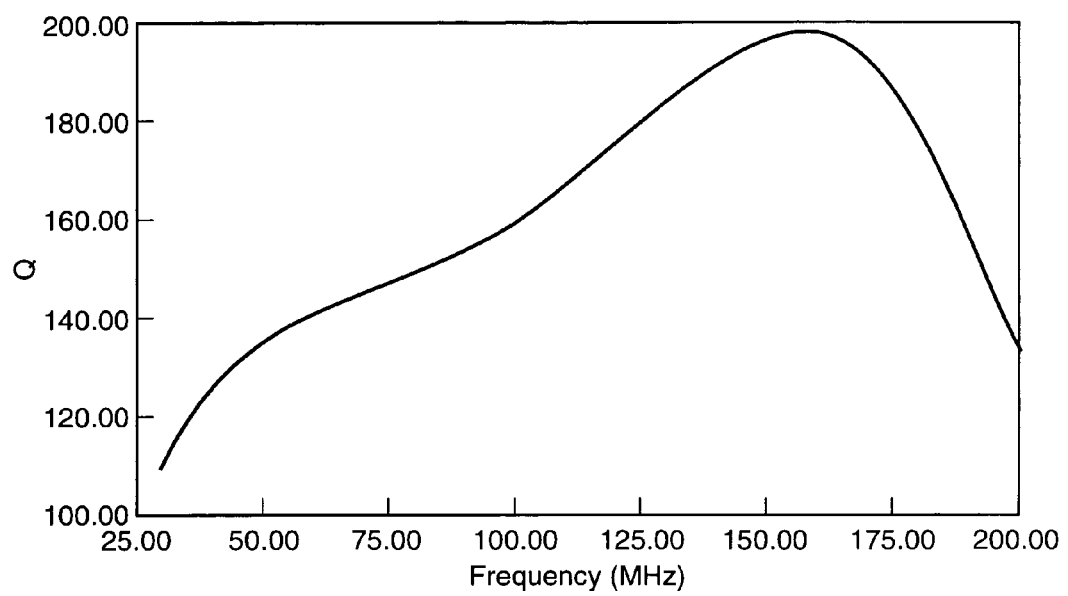
FIG. 5 is a graph showing the Q factor of an example inductor or the invention, as it varies with frequency up to 200 MHz.

FIG. 5 is a graph plotting the Q factor of the inductor 10 (with eight turns per segment) over a range of frequencies from 25 to 200 MHz (megahertz). It will noted that the value of Q rises relatively steeply with frequency at low frequencies, and plateaus at close to Q=200 for a frequency range of 145–165 MHz. With appropriate optimization of the inductor physical parameters (the conductor geometry and choice of dielectrics), the shape of the plateau in Q may be tailored for particular applications. This contourable Q is unique to this self coupled inductor structure and offers advantages to filter/resonant structures not possible with other conventional structures, ie solenoid, toroid, etc. Typical Q curves for solenoidal or toroidal inductors exhibit smoothly increasing characteristics (in Q) with no "hump" as shown in FIG. 5 (from 25 to 100 MHz, respectively).

Figure 6:
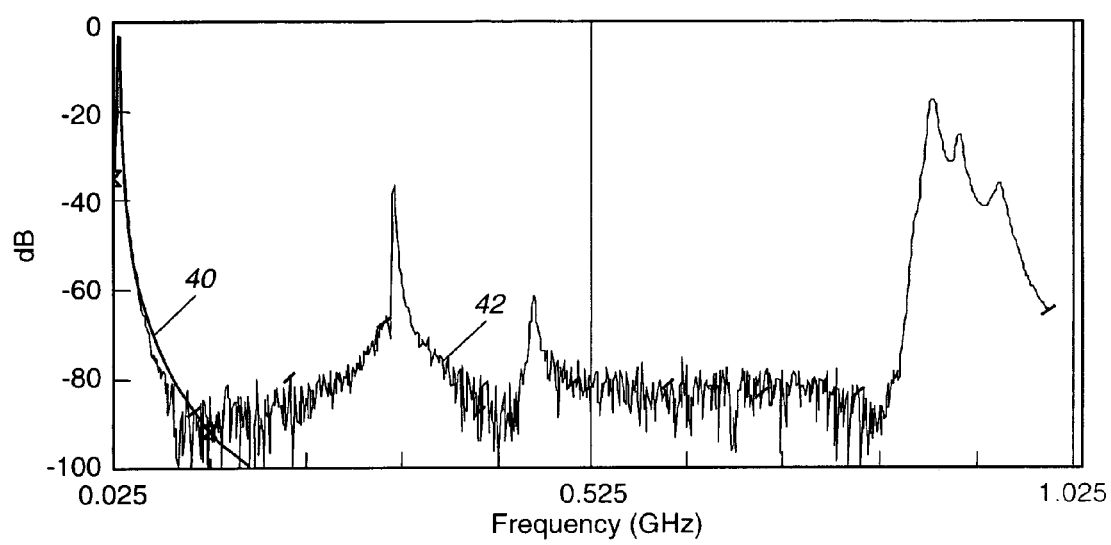
FIG. 6 is a graph depicting frequency selectivity of an example filter response using the inductor in FIG. 5 over a frequency range up to approximately 1.0 GHz; simulated and measured versions of the filter characteristics are shown in FIG. 6.

FIG. 6 depicts the frequency selectivity provided by the inductor of the invention in the context of a two-pole filter. The steeply falling curve 40 is characteristic of the simulated inductor and the other curve 42 is representative of actual test measurements. The inductor has a self resonance at close to 1 GHz, well above a frequency range of interest for the filter, and also substantially above the self resonance frequency for comparable solenoid inductors. The curve 42 also shows that the inductor of the invention provides, for the most part, a minimum selectivity of approximately 80 dB, compared with 50–60 dB that is typical for solenoid inductors.

Figure 7:
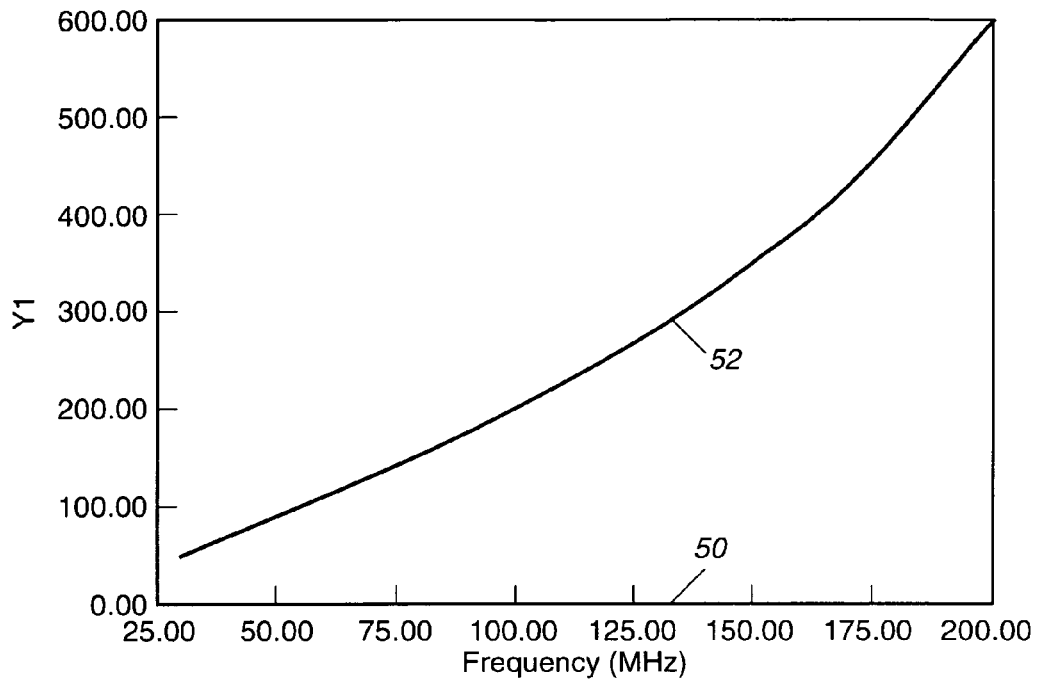
FIG. 7 is a graph depicting the variation of real and imaginary components of inductor impedance over a frequency range up to 200 MHz.

FIG. 7 plots the inductor impedance across a frequency range of interest from 35–200 MHz. The real (resistive) component of the inductor impedance is extremely low and is plotted as curve 50, and the imaginary (inductive) component of the impedance is plotted as curve 52. The low real component of impedance is, of course, indicative of a high Q factor.

Figure 8:
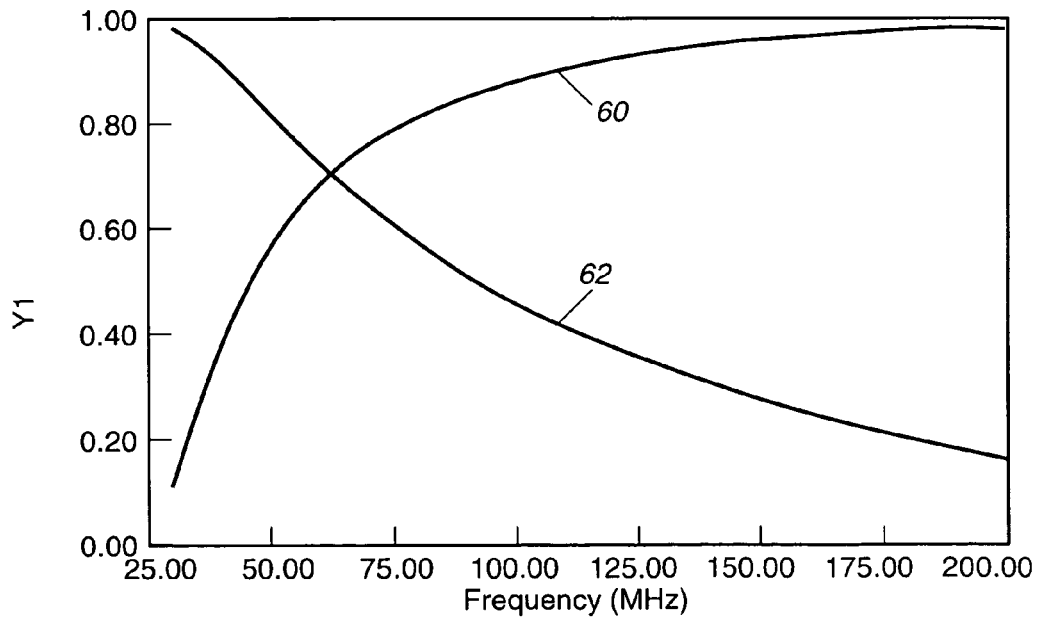
FIG. 8 is a graph depicting the variation of real and imaginary components of the inductor s-parameter over a frequency range up to 200 MHz.

FIG. 8 plots real and imaginary components (curves 60 and 62. respectively) of the inductor s-parameters over the same range of frequencies as in FIG. 7.

It will be appreciated from the foregoing that the present invention provides a significant advance in the field of inductor design for HF circuits. In particular, the invention provides an extremely compact inductor implemented as metallized traces on two planar layers of a printed circuit board (or other substrate, e.g., LTCC), with metallized vias interconnecting the traces to form a pair of conductive coils with toroidal inductor characteristics. It will also be appreciated that, although a specific embodiment of the invention has been illustrated and described for purposes of illustration, various modifications may be made without departing from the spirit and scope of the invention. Accordingly, the invention should not be limited except as by the appended claims.

The invention claimed is:

1. A compact inductor structure in two coplanar layers of a circuit board, the inductor structure comprising:
    a dielectric substrate having upper and lower faces;
    a first set of parallel conductive traces formed on the upper face of the substrate in a first plane;
    a second set of parallel conductive traces formed on the lower face of the substrate in a second plane;
    a plurality of metallized vias extending through the substrate and interconnecting the first and second sets of conductive traces to form a continuous spiral path with inductive properties;
    the first and second sets of parallel conductive traces are arranged in two adjacent ranks wherein the first set of traces in one rank is coplanar with the first set of traces in the other rank, and the second set of traces in one rank is coplanar with the second set of traces in the other rank so that the first and second sets of traces for both of the two ranks are contained in the same two parallel planes.

2. A compact inductor structure as defined in claim 1, wherein:
    the metallized vias form with the conductive traces a first spiral path and a second spiral path; and
    the structure further comprises a conductive trace that connects the first and second spiral paths in series;
    wherein the first and second spiral paths form spatially parallel, serially connected inductor segments that are magnetically coupled together to form a composite inductor with desirably high inductance and Q values.

3. A compact inductor structure as defined in claim 1, wherein:
    the metallized vias are formed in a direction normal to the upper and lower faces of the substrate; and
    the first and second sets of parallel conductive traces are angularly offset with respect to each other, such that each metallized via makes a connection from one end of a trace in the first set to an end of the next successive trace in the second set.

4. A compact inductor structure as defined in claim 1, and further comprising:
    a connecting trace in the second set of traces in one rank disposed to form a last trace near a distal edge of the one rank, the connecting trace having an end that extends within the second plane into the other rank, a via in the second rank connects to the end of the connecting trace to form an electrical interconnection between the first and second ranks.

5. A compact inductor structure as defined in claim 1 wherein the one rank is disposed adjacent and lateral to the other rank.

6. A compact inductor structure as defined in claim 5 wherein the spiral paths in the one rank do not overlap the spiral paths in the other rank except for a single connecting trace near one edge of the first rank that interconnects the first and second ranks so that the spiral paths in the first and second ranks are traversed in series.

7. A method for making a compact inductor embedded in a printed circuit board structure, the method comprising:
    providing a dielectric substrate having upper and lower faces;

forming a first set of generally parallel conductive traces on the upper face of the substrate in a first plane;

forming a second set of generally parallel conductive traces on the lower face of the substrate in a second lane; and forming a plurality of conductive vias through the substrate at positions corresponding to ends of the conductive traces;

wherein the first and second sets of conductive traces and the plurality of conductive vias together form a continuous spiral conductive path with desirable inductance properties;

forming two adjacent ranks of the first and second sets of parallel conductive traces wherein the first set of traces in one rank is formed coplanar with the first set of traces in the other rank, and the second set of traces in one rank is fromed coplanar with the second set of traces in the other rank so that the first and second sets of traces for both of the two ranks are contained in the same two parallel planes.

8. A method as defined in claim 7, and further comprising:

forming additional dielectric layers over the first and second conductive traces.

9. A method as defined in claim 7, and further comprising:

forming a connecting trace in the second set of traces in one rank disposed to form a last trace near a distal edge of the one rank, the connecting trace having an end that extends within the second plane into the other rank;

connecting a via in the second rank to the end of the connecting trace to form an electrical connection between the first and second ranks.

10. A method as defined in claim 7, and further comprising:

forming additional parallel conductive traces on the upper and lower faces of the substrate and additional conductive vias through the substrate, wherein the additional conductive traces and the additional vias together form a second continuous spiral conductive path closely adjacent to the continuous spiral conductive path formed by the first and second sets of conductive traces; and forming an electrical connection between the continuous spiral conductive paths, thereby connecting them electrically in series in such a way that current flowing through the two spiral conductive paths will produce oppositely directed magnetic flux fields through the two adjacent spiral paths;

wherein the oppositely directed magnetic flux fields closely couple to each other at ends of the spiral paths, to produce a tightly coupled magnetic circuit and high values of inductance with a rapidly increasing and contourable low frequency Q factor.

11. A method as defined in claim 7, wherein:

the steps of forming the second set of conductive traces comprises forming the second set to be parallel with each other but not with the first set of conductive traces, wherein opposite ends of each trace in the second set are located near adjacent traces in the first set; and the step of forming vias comprises forming vias that are substantially normal to the upper and lower faces of the substrate, wherein each via connects a conductive trace in the first set to an adjacent conductive trace in the second set.

* * * * *